United States Patent [19]
Lacap

[11] Patent Number: 5,866,941
[45] Date of Patent: Feb. 2, 1999

[54] ULTRA THIN, LEADLESS AND MOLDED SURFACE MOUNT INTEGRATED CIRCUIT PACKAGE

[75] Inventor: Efren M. Lacap, Tustin, Calif.

[73] Assignee: Silicon Systems, Inc., Tustin, Calif.

[21] Appl. No.: 690,211

[22] Filed: Jul. 26, 1996

Related U.S. Application Data

[63] Continuation of Ser. No. 393,557, Feb. 23, 1995, Pat. No. 5,598,583.

[51] Int. Cl.$^6$ ............... H01L 23/48; H01L 23/02; H01L 23/52
[52] U.S. Cl. ............... 257/697; 257/678; 257/690; 257/693
[58] Field of Search ................... 257/697, 690, 257/778, 698, 693, 787, 737, 706, 786, 678

[56] References Cited

U.S. PATENT DOCUMENTS

| | | | |
|---|---|---|---|
| 4,868,638 | 9/1989 | Hirata et al. | 257/697 |
| 5,334,857 | 8/1994 | Mennett et al. | 257/778 |
| 5,446,313 | 8/1995 | Masuda et al. | 257/666 |
| 5,468,995 | 11/1995 | Higgins | 257/697 |

FOREIGN PATENT DOCUMENTS

| | | | |
|---|---|---|---|
| 61-174752 | 8/1986 | Japan | 257/697 |
| 61174752 | 8/1986 | Japan | 257/697 |
| 1-44051 | 2/1989 | Japan | 257/697 |
| 2-60149 | 2/1990 | Japan | 257/787 |
| 2125650 | 5/1990 | Japan | 257/697 |
| 2-125650 | 5/1990 | Japan | 257/697 |
| 2239649 | 9/1990 | Japan | 257/697 |
| 5144995 | 6/1993 | Japan | 257/697 |

OTHER PUBLICATIONS

Electronic Packagin and Ineterconnection Handbook, pp. 7.24–7.26, C. Harper.

*Primary Examiner*—Mahshid Saadat
*Assistant Examiner*—Jhihan B Clark
*Attorney, Agent, or Firm*—W. Daniel Swayze, Jr.; Wade James Brady, III; Richard L. Donaldson

[57] ABSTRACT

The present invention is an integrated circuit package that comprises a substrate whose top side has a number of conductive and insulative portions. A die on which an integrated circuit is fabricated is placed on the top side of the substrate. A number of bond wires connect on chip electrical connection pads to respective conductive portions of the top side of the substrate. Each conductive portion on the top side of the substrate is connected to a respective solder plated/dispensed pad on the bottom side of the substrate. A molding compound is formed on the top side of the substrate to encapsulate the die and the bond wires. The bottom side of the substrate, including the solder plated/dispensed pads, remains unmolded. The invention represents a number of advances in the art. For example, the invention results in an ultra thin package that can be used in PCMCIA Type I and Type II modules and cards. One embodiment of the ultra thin package of the invention has a thickness of approximately 0.70 millimeters.

3 Claims, 5 Drawing Sheets

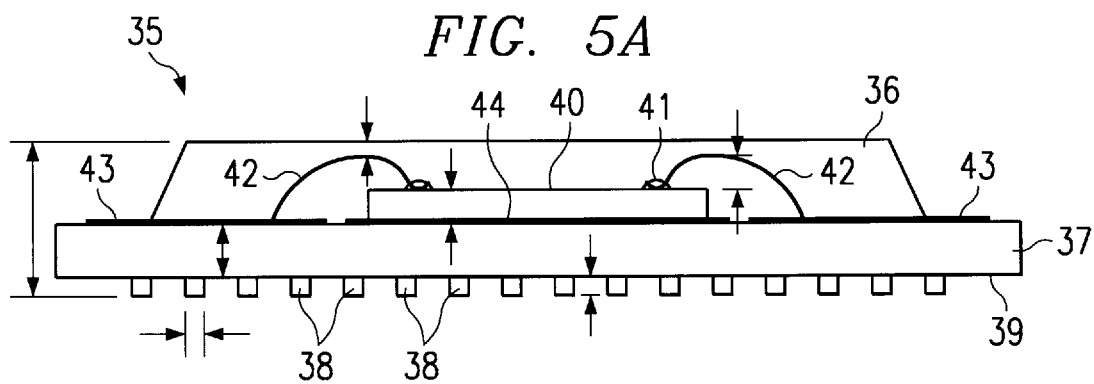
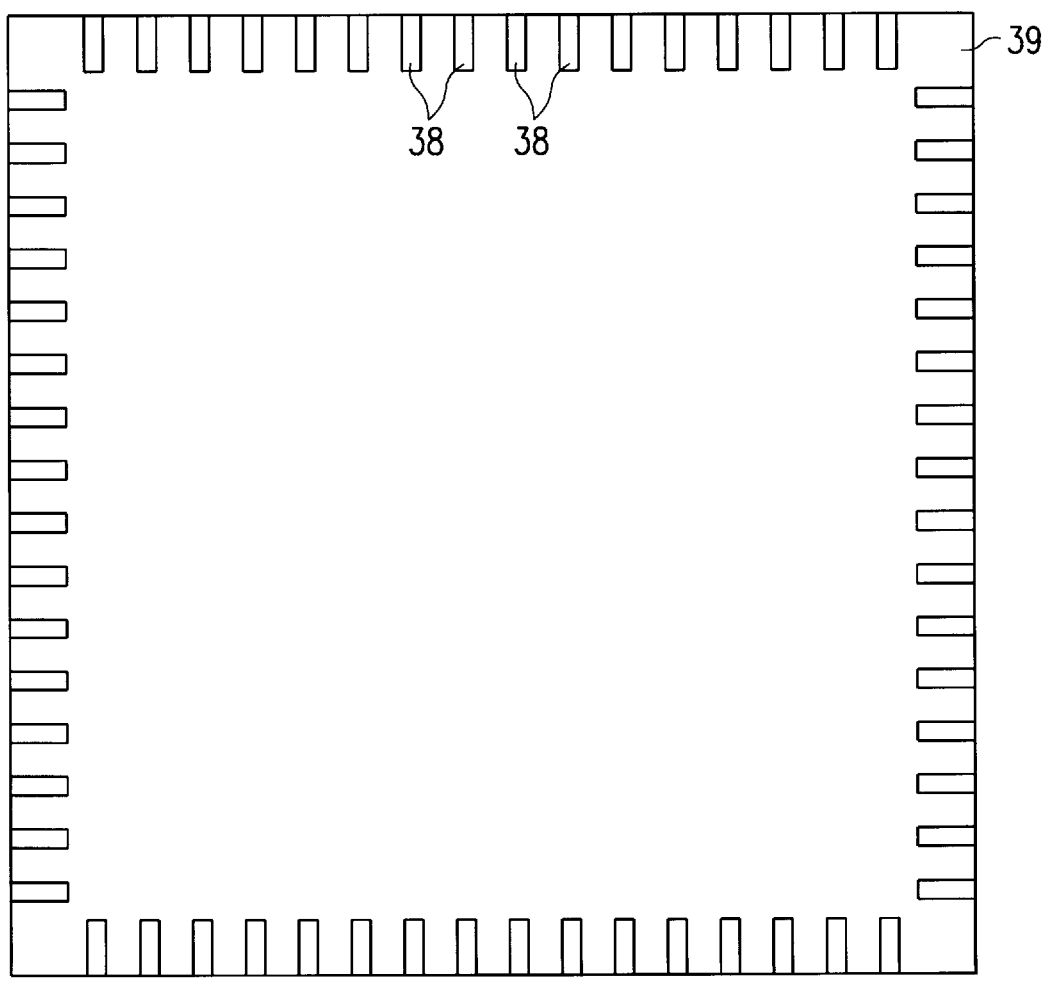

ULTRA THIN, LEADLESS AND MOLDED SURFACE MOUNT INTEGRATED CIRCUIT PACKAGE

This is a continuation of application Ser. No. 08/393,557 filed on Feb. 23, 1995, now U.S. Pat. No. 5,598,583.

BACKGROUND OF THE INVENTION

1. Field of the Invention

The present invention relates to the field of integrated circuit packaging. In particular, the present invention relates to ultra thin and leadless surface mount packages.

2. Background Art

Prior art integrated circuits are packaged in plastic packages in which the integrated circuit is fully sealed in the packages. Such fully sealed packages typically have a minimum thickness of 2.0 millimeters. When mounted on a printed circuit board, the top of these packages stands at least 2.0 millimeters high in relation to the surface of the printed circuit board. The height is typically more than 2.0 millimeters since additional space is consumed by pins typically protruding from the bottom of the fully sealed packages. An example of this type of prior art package is a Plastic Pin Grid Array (PPGA). FIG. 1 shows the bottom view of a prior art PGA. As shown in FIG. 1, an array of pins 10 protrude from thee bottom of the package. Pins 10 penetrate holes drilled in a printed circuit board (not shown). Pins 10 are then soldered to conductive patterns laid out on the top and bottom surfaces of the printed circuit board.

Recently, surface mount packages have dispensed with the requirement of pins protruding from the bottom of the package. Instead, surface mount packages use leads that are designed to lie flush with the surface of the printed circuit board. Examples of such surface mount packages are a "Thin Quad Flat Package" (TQFP) and a "Very Thin Small Outline Package" (VTSOP). An example of a typical prior art TQFP is shown in FIG. 2. FIG. 2, shows a side view of a TQFP 12 in which side views of only two leads 14 and 16 are shown for the purpose of illustration. Other leads 18 in the TQFP are identically configured and have the same appearance as the two exemplary leads 14 and 16 when viewed from the side. As shown in FIG. 2, each lead 14 or 16 is shaped so that it inclines toward the surface of the printed circuit board (not shown) and then lies flat on the surface of the printed circuit board.

As shown in FIG. 2, the TQFP typically occupies about 1.2 millimeters of vertical space. This space cannot be reduced to any significant extent since the thickness of the molded body of a TQFP limits the minimization of the vertical space occupied by the TQFP. In other words, the thickness of the molded body 22 of TQFP 12 represents the minimum thickness that can be achieved with the TQFP regardless of how leads 18 are designed.

Other prior art attempts at minimizing the vertical space occupied by an integrated circuit package have also reached their limits. FIGS. 3A through 3D illustrate different prior art integrated circuit packages. FIG. 3A is a Flat Pack (FP) package. As seen in FIG. 3A, leads 26 protrude from the sides of molded body 27 of FP 28. Typically, a rectangular opening is made within a printed circuit board (not shown) and FP 28 is placed inside the opening and is supported by leads 26 which are soldered to the surface of the printed circuit board. Accordingly, the bottom half of body 27 no longer adds to the height of FP package 28. However, one of the drawbacks of FP 28 is that an opening must be made in the printed circuit board. This results in several disadvantages. For example, creating a hole in the printed circuit board causes a reduction in the available area for laying out conductive patterns on the top and bottom surfaces of the printed circuit board. Further, creating a hole in the printed circuit board results in additional cost in designing and manufacturing the printed circuit board. Another drawback in using FP 28 is that the bottom half of molded body 27 extends beyond the bottom surface of the printed circuit board. Accordingly, additional space below the bottom surface of the printed circuit board is required to provide clearance for the bottom half of body 27. Thus, although FP 28 stands lower than other packages having a body of the same thickness, FP 28 extends below the surface of the printed circuit board, therefore requiring a bottom clearance.

FIG. 3B illustrates a Ceramic Quad Flat (CQF) 29 which is a variation of FP 28. CQF 29 suffers from the same disadvantages suffered by FP 28.

FIG. 3C illustrates a Leadless Ceramic Chip Carrier (LCCC) 30. LCCC 30 is an example of a fully sealed surface mount package. The entire thickness of molded body 31 of LCCC 30 stands above the printed circuit board. As stated above, this vertical space is typically no less than 1.2 millimeters. FIG. 3D is another example of a surface mount package called a Ceramic Leaded Chip Carrier (CLCC) 32. The leads of CLCC 32 are similar to leads 18 of TQFP 12 shown in FIG. 2. As with TQFP 12 and LCCC 30, molded body 33 of CLCC 32 also stands entirely above the printed circuit board, thus requiring a clearance of at least 2.0 millimeters.

Another recent prior art surface mount package is the OverMolded Pad Array Carrier (OMPAC) 34 shown in FIG. 3E. As shown in FIG. 3E, an array of solder balls 35 is arranged on the bottom surface 36 of OMPAC 34. The array of solder balls interfaces with a printed circuit board. The advantage of OMPAC 34 over "leaded" surface mount packages is that OMPAC 34 eliminates concerns regarding lead coplanarity and skew. However, as with all the prior art surface mount packages discussed above, OMPAC 34 requires at least a 2.0 millimeters of height clearance above the surface of the printed circuit board on which OMPAC 34 is mounted. This is because, like the prior art surface mount packages discussed above, OMPAC 34 is fully molded and the full thickness of the molded body of OMPAC 34 stands above the printed circuit board.

Use of the prior art surface mount packages is generally limited to larger form factor electronic systems, including Personal Computer Memory Card International Association (PCMCIA) Type III (10.5 millimeters) disk drives, modules and cards. However, as portable computing systems are designed around smaller form factor electronic systems, such as those conforming to PCMCIA Type II (having a thickness of 5.0 millimeters) and PCMCIA Type I (having a thickness of 3.3 millimeters) standards, there is a need for integrated circuit packaging technology that is compatible with these smaller form factor electronic systems. Although the prior art has attempted a "Chip On Board" (COB) technology as an option for small form factor packaging, the technology suffers from several disadvantages. First, it is difficult to test the dies or determine the number of good dies mounted on printed circuit boards. Second, the cost of converting manufacturing lines to produce chips on boards is extremely high and has thus prevented chip manufacturers to pursue the COB technology. Thus, there is still need in the art for a single package solution that is less expensive to produce and easier to test (for example, easier to test for Known Good Die, or test at full temperature range, or at full speed) than the COB technology.

Thus, there is need in the art for a surface mount package with a substantially reduced thickness so as to permit integrated circuits to be effectively used in computer card modules and other applications where overall height is very limited. Specifically, there is need in the art to substantially reduce the 2.0 millimeter height of the prior art surface mount packages.

SUMMARY OF THE INVENTION

The present invention is an integrated circuit package that comprises a substrate whose top side has a number of conductive and insulative portions. A die on which an integrated circuit is fabricated is placed on the top side of the substrate. A number of bond wires connect on chip electrical connection pads to respective conductive portions of the top side of the substrate. Each conductive portion on the top side of the substrate is connected to a respective solder plated/ dispensed pad on the bottom side of the substrate. A molding compound is formed on the top side of the substrate to encapsulate the die and the bond wires. The bottom side of the substrate, including the solder plated/dispensed pads, remains unmolded.

The invention represents a number of advances in the art. For example, the invention results in an ultra thin package that can be used in PCMCIA Type I and Type II modules and cards. One embodiment of the ultra thin package of the invention has a thickness of approximately 0.70 millimeters.

BRIEF DESCRIPTION OF THE DRAWINGS

FIG. 5 illustrates cross-sectional and bottom views of an embodiment of the UTLP of the present invention.

DETAILED DESCRIPTION OF THE PRESENT INVENTION

An ultra thin, leadless, and molded surface mount integrated circuit package is described. In the following description, numerous specific details are set forth in order to provide a more thorough understanding of the present invention. It will be apparent, however, to one skilled in the art, that the present invention may be practiced without these specific details. In other instances, well known features have not been described in detail so as not to obscure the present invention.

Figure 4:
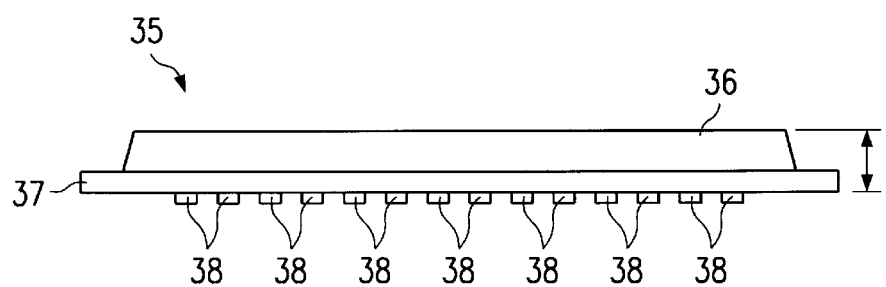
FIG. 4 illustrates an overview of the present invention's ultra thin, leadless, and molded package (UTLP).
Figure 3A:
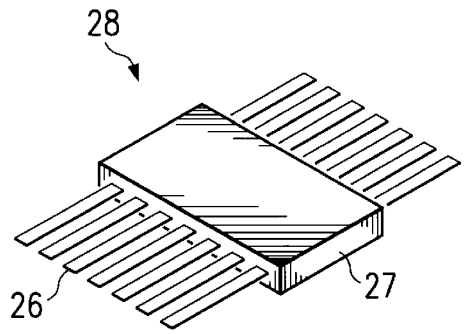
FIG. 3A illustrates a prior art "Flat Pack" (FP) package.
Figure 3B:
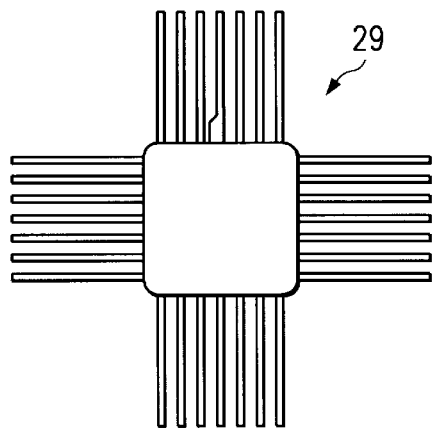
FIG. 3B illustrates a prior art "Ceramic Quad Flat" (CQF) package.
Figure 3C:
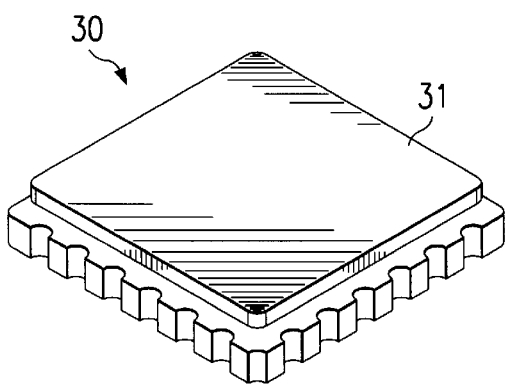
FIG. 3C illustrates a prior art "Leadless Ceramic Chip Carrier" (LCCC) package.
Figure 3D:
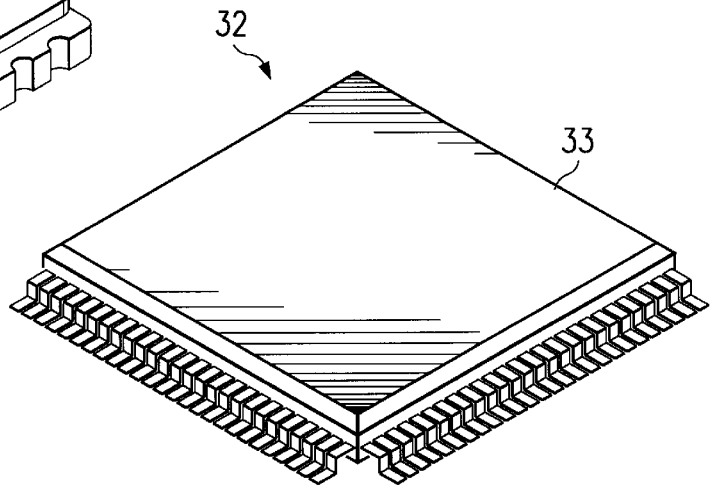
FIG. 3D illustrates a prior art "Ceramic Leaded Chip Carrier" (CLCC) package.
Figure 3E:
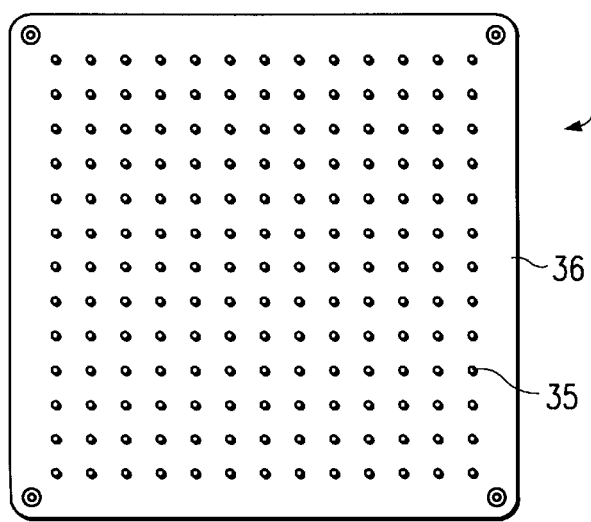
FIG. 3E illustrates a prior art "OverMolded Pad Array Carrier" (OMPAC) package.

FIG. 4 illustrates an overview of one embodiment of the ultra thin, leadless, and molded surface mount integrated circuit package (hereinafter referred to as "UTLP") 35 of the present invention. The top portion of UTLP 35 comprises a molded body 36 which covers and protects a semiconductor die. As shown in FIG. 4, substrate 37 is located below and supports the semiconductor die. Substrate 37 performs a number of important and unique functions in the present invention; these functions will be discussed below. Solder plated/dispensed pads 38 directly interface substrate 37, on one side, and a printed circuit board (not shown) on the other side. Solder plated/ dispensed pads 38 provide connection between the circuitry of the semiconductor die located on top of substrate 37 and the printed circuit board. UTLP 35 of the embodiment of FIG. 4 has a height of 0.70 millimeters (measured from the lowest to highest portion of UTLP 35) and as such has a much lower height than the prior art surface mount packages having a minimum height of 1.2 or 2.0 millimeters, depending on the type of the prior art package. Accordingly, UTLP 35 provides appropriate packaging for integrated circuits to be used in small form factor electronic systems such as Personal Computer Memory Card International Association (PCMCIA) Type I or Type II Modules where available vertical space is very limited.

FIG. 5 is a cross-sectional side view of an embodiment of UTLP 35 which illustrates the geometry and configuration of various sections of UTLP 35 in more detail. As shown in FIG. 5, mold compound 36 encapsulates die 40. Die 40 is attached to substrate 37 by a die attach epoxy 44. Die attach epoxy 44 is typically a silver filled epoxy so as to provide die 44 with electrical connection to a ground plane of substrate 37. The ground plane of substrate 37 (not shown) is in turn connected to external ground through one or several of solder plated/dispensed pads 38. On chip electrical connection pads 41 are connected to input and output circuits on die 40. Thus, on chip pads 41 provide connection between circuits external to die 40, such as circuits on a printed circuit board (not shown) and circuits internal to die 40. Bond wires 42 connect on chip pads 41 to conductors 43 on substrate 37. Bond wires 42 are typically made of gold to minimize electrical resistance that may otherwise be significant due to the thinness of the bond wires.

Conductors 43 are typically copper plated conductors that are shaped in the form of stripes. The conductive stripes are insulated from one another by insulative portions of substrate 37. Typically one copper plated conductor 43 is used for connection to a respective solder plated/dispensed pad 38 (the connections between copper plated conductors 43 and solder plated/dispense pads 38 are not shown). Conductive portions within substrate 37 (not shown) connect each copper plated conductor 43 to its respective solder plated/ dispensed pad 38. Substrate 37 is preferably made of a single-layer or multi-layer resin. Thus, substrate 37 is not an electrical conductor except for the conductive portions within substrate 37 that connect copper plated conductors 43 to solder plated/dispensed pads 38. Solder plated/dispensed pads 38 in one embodiment, are made of an alloy consisting of 62% tin, 36% lead, and 2% silver.

Various geometries of UTLP 35 according to one embodiment of the invention are illustrated in FIG. 5. For the embodiment of FIG. 5, the overall height of UTLP 35 from the bottom of solder plated/dispensed pads 38 to the top of mold compound 36 is 0.70 millimeters. As stated above, this is a significant improvement over the prior art surface mount package height of at least 1.2 millimeters. The thickness of mold compound 36 is approximately 0.46 millimeters. Substrate 37 is typically 0.18 millimeters in thickness and solder plated/dispensed pads 38 extend approximately 0.01 millimeters below bottom surface 39 of UTLP 35. Each solder plated/dispensed pad 38 is approximately 0.5 millimeters wide to provide sufficient width for soldering UTLP 35 to the printed circuit board. As shown in FIG. 5, mold compound 36 encapsulates die 40 and bond wires 42. Die 40 is typically 0.2 millimeters thick. The crest of bond wires 42 is approximately 0.13 millimeters above the top of die 40 and 0.13 millimeters below the top surface of molding compound 36.

FIG. 5 also illustrates the bottom plan for bottom 39 of the embodiment of the invention shown in FIG. 5. The bottom plan of the UTLP embodiment shown in FIG. 5 consists of a single row of solder plated/ dispensed pads 38 around the perimeter of UTLP 35. As stated above, solder plated/ dispensed pads 38 provide connections to external circuits located on the printed circuit board.

Figure 6A:
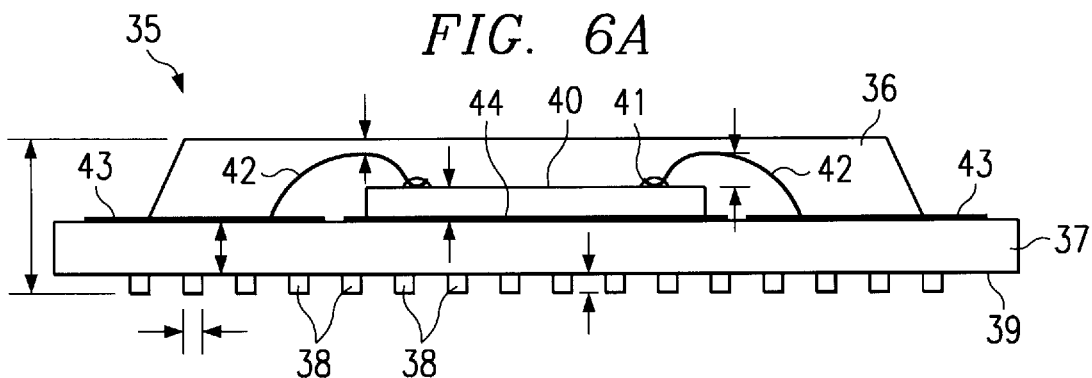
FIG. 6 illustrates the bottom view of another embodiment of the UTLP of the present invention.
Figure 6B:
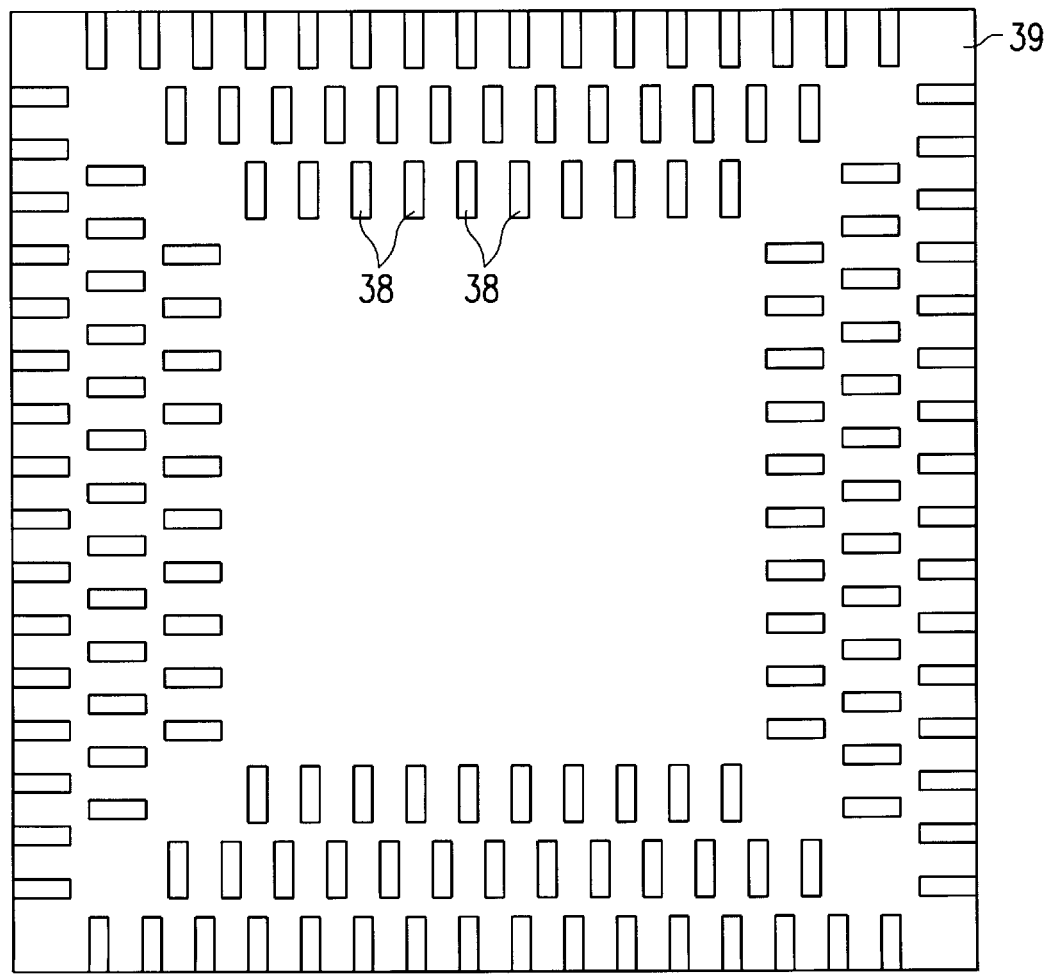

FIG. 6 illustrates a UTLP embodiment with a bottom plan for bottom 39 that is different from the bottom plan shown in FIG. 5. The bottom plan for the embodiment of the invention shown in FIG. 6 consists of multiple rows of staggered solder plated/dispensed pads 38. Solder plated/ dispensed pads 38 are arranged so that the pads do not lie in the same line. Accordingly, connections to separate conductive portions of the printed circuit board can be made without requiring conductors to "cross over" one another. With the exception of the arrangement of solder plated/ dispensed pads in the embodiment of FIG. 6, the arrangement of the remaining portions of UTLP 35 in FIG. 6 is identical to that of the embodiment of FIG. 5.

Figure 7:
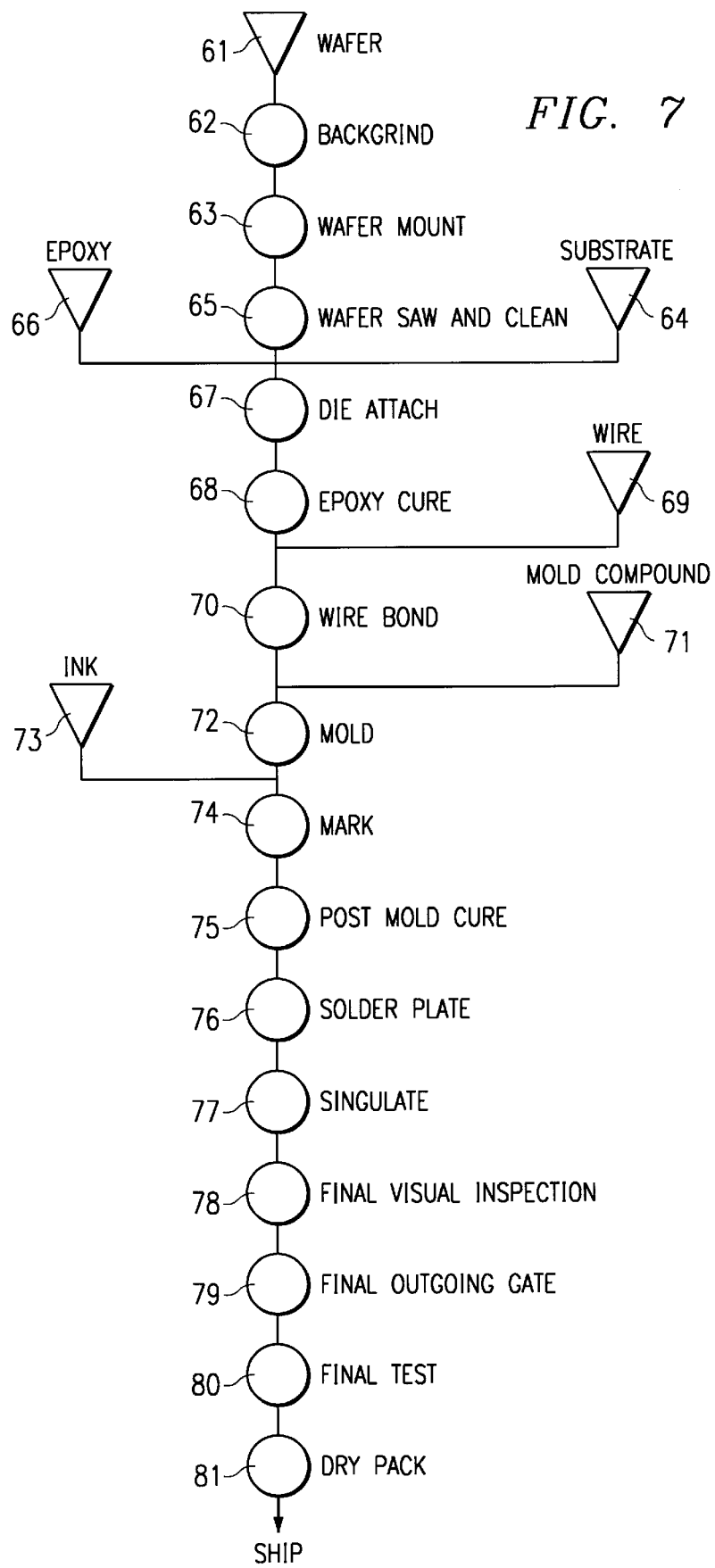
FIG. 7 is a flow chart of the process for fabricating the UTLP of the present invention.

FIG. 7 is a flow chart illustrating a method for fabricating UTLP 35 of the embodiments of the invention shown in FIGS. 5 and 6. As shown in FIG. 7, a semiconductor wafer, containing a number of processed dies, is provided at step 61. At step 62 the wafer is subjected to a back grinding process. At step 63, the wafer is mounted on machines that dice the wafer into a number of dies. At step 65, the wafer is diced and the dies are cleaned to eliminate particles that can otherwise cause shorts in the internal circuitry of the dies. An example of a complete die is die 40 shown in FIG. 5. At step 64 a resin substrate, such as substrate 37 shown in FIG. 5, is provided along with a silver filled epoxy (step 66) that provides electrical connection between die 40 and a ground plane laid on the top surface of the substrate. The substrate ultimately interfaces with a printed circuit board.

At step 67 the cleaned dies are attached to their respective substrates with the silver filled epoxy provided at step 66. At step 68, the die attach epoxy is cured. At step 70, gold wire bonds provided at step 69 are bonded to electrical connections pads on the surface of the dies. At step 72, a mold compound provided at step 71 overmolds the dies and bond wires. The mold compound encapsulates the dies and the bond wires as shown in FIG. 5. At step 74, ink provided at step 73 is used to mark the top surface of the mold compound. The ink is used to provide various information, such as the part number and the name of the manufacturer, regarding the part. The ink and the mold are cured at step 75. At step 76, solder plated/dispensed pads are provided for the bottom surface of the substrate. Solder plated/dispensed pads 38 provided for bottom 39 of substrate 37 shown in FIG. 5 are examples of the solder plated/dispensed pads provided at step 76. The solder plated/ dispensed pads are connected, via conductive portions inside the substrate, to respective conductive plates on the top surface of the substrate. The solder plated/dispensed pads are insulated from one another by insulative portions of the substrate.

The overmolded and solder plated die assemblies now form complete integrated circuit packages which are singulated at step 77. At step 78 the packages are visually inspected for possible defects. At steps 79 and 80 the packages undergo complete electrical tests. The tests determine whether the packages meet various "specification requirements" such as operating within temperature range (for example between zero degree centigrade to 80 degrees centigrade), and operating at the required speed. The tests also determine electrical performance of various parts of the integrated circuits such as operation at low or high power supply voltages and the electrical performance of the output and input circuits in various conditions. After the packages are fully tested at step 80, the packages are packed in appropriate containers and shipped at step 81.

Figure 1:
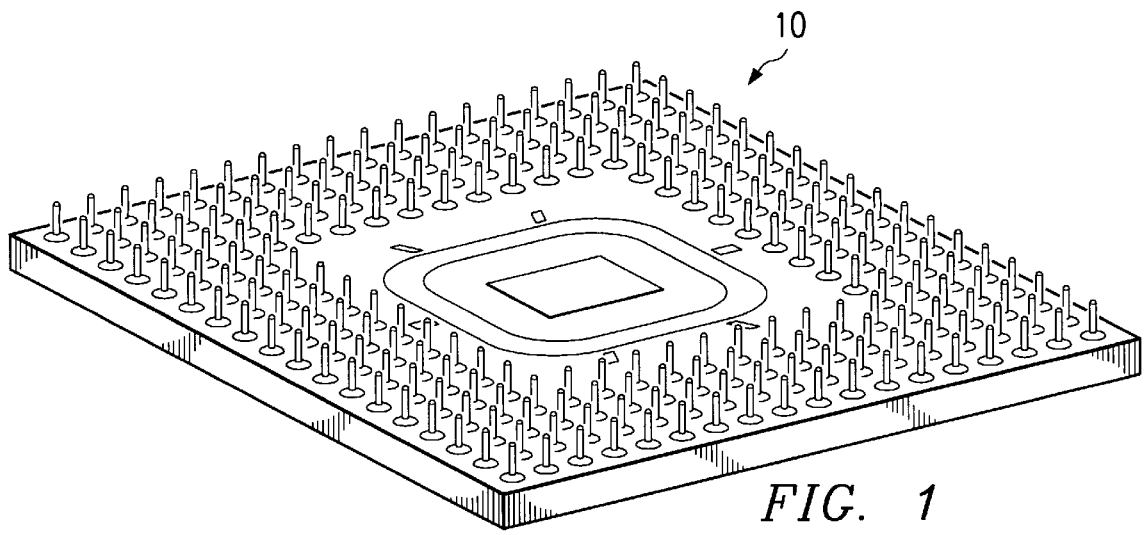
FIG. 1 illustrates a prior art Plastic Pin Grid Array (PPGA) package.
Figure 2:
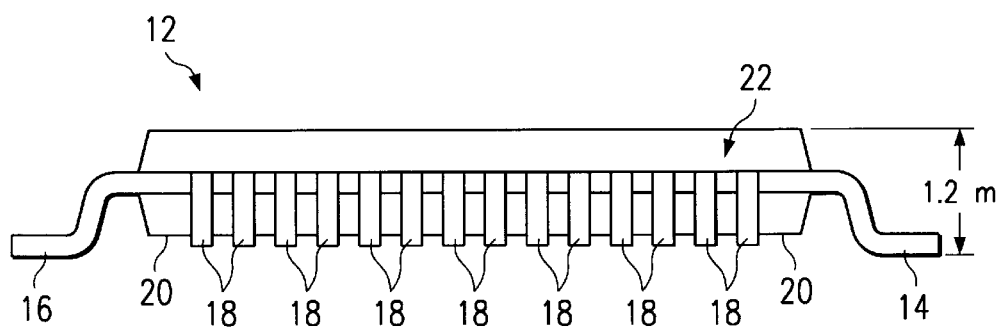
FIG. 2 illustrates a prior art "Thin Quad Flat Package" (TQFP).

The ultra thin, leadless, and molded surface mount integrated circuit package of the present invention presents a number of advantages over the prior art surface mount packages. First, the UTLP of the present invention is a novel half-molded (i.e. encapsulated on only one side of the substrate) package. As stated above, the half-molded package results in a very small height of 0.70 millimeters or less. This allows the UTLP of the invention to be used in PCMCIA Types I and II modules and cards. Second, the UTLP of the invention results in the elimination of the package "footprint." A package footprint is the area consumed by leads of a package beyond the area consumed by the molding of the package. For example, the prior art TQFP shown in FIG. 2 has a "footprint" of approximately 2.0 millimeters. In contrast, the UTLP of the invention shown in FIG. 4 has a zero millimeter footprint. In other words, the area circumscribed by the package footprint is substantially equal with the area circumscribed by the package molding. This zero footprint is a result of providing solder plated/ dispensed pads 38 directly under and interfacing with substrate 37 of the UTLP of the invention. The elimination of the package footprint results in a reduction of the total printed circuit board area required by the package. The elimination of leads also results in reduced resistance, inductance and capacitance between circuits on die 40 and circuits on the printed circuit board. Third, use of staggered and multiple rows of solder plated/dispensed pads in the embodiment of the invention shown in FIG. 6 results in a significant increase in the number of electrical connections available. Fourth, unlike many prior art techniques, the UTLP of the present invention can provide packaging for multiple dies as well as for a single die.

Although the present invention has been described with reference to certain illustrated embodiments, it is appreciated by those skilled in the art that changes in various details may be made without departing from the invention defined in the appended claims. Thus, an ultra thin, leadless, and molded surface mount integrated circuit package has been described.

It is claimed:

1. An integrated circuit package comprising:
   a substrate;
   a die disposed on a first side of said substrate;
   a plurality of rectangular conductive pads placed on a second side of said substrate,
   said plurality of rectangular conductive pads being electrically connected to said die;
   a molded portion formed on said first side but not said second side of said substrate, said molded portion encapsulating said die;
   said die being electrically connected to a ground plane of said substrate, and a ground plane being electrically connected to an external ground by one of said plurality of rectangular conductive pads; and wherein said plurality of rectangular conductive pads on said second side of said substrate are arranged in a plurality of rows, each of said plurality of rows being offset from a neighboring row;

wherein said package has a thickness of less than 0.70 millimeters.

2. An integrated circuit package comprising:

a substrate;

a die disposed on a first side of said substrate;

a plurality of rectangular conductive pads placed on a second side of said substrate, said plurality of rectangular conductive pads being electrically connected to said die;

a molded portion formed on said first side but not said second side of said substrate, said molded portion encapsulating said die;

said die being electrically connected to a ground plane of said substrate, and a ground plane being electrically connected to an external ground by one of said plurality of rectangular conductive pads; and wherein said plurality of rectangular conductive pads on said second side of said substrate are arranged in a plurality of rows, each of said plurality of rows being offset from a neighboring row;

wherein an area consumed by leads of said package is substantially equal to an area circumscribed by said molded portion.

3. An integrated circuit package comprising:

a substrate;

a die disposed on a first side of said substrate;

a plurality of rectangular conductive pads placed on a second side of said substrate, said plurality of rectangular conductive pads being electrically connected to said die;

a molded portion formed on said first side but not said second side of said substrate, said molded portion encapsulating said die;

said die being electrically connected to a ground plane of said substrate, and a ground plane being electrically connected to an external ground by one of said plurality of rectangular conductive pads; and wherein said plurality of rectangular conductive pads on said second side of said substrate are arranged in a plurality of rows, each of said plurality of rows being offset from a neighboring row;

wherein leads of said package are substantially within an area consumed by said package.

* * * * *